(12) United States Patent
Sung et al.

(10) Patent No.: US 10,147,880 B2
(45) Date of Patent: Dec. 4, 2018

(54) MASK FOR THIN FILM DEPOSITION AND METHOD OF MANUFACTURING OLED USING THE SAME

(71) Applicant: Samsung Display Co., Ltd., Yongin-si, Gyeonggi-do (KR)

(72) Inventors: Dong-Young Sung, Yongin-si (KR); Hong-Ryul Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 155 days.

(21) Appl. No.: 15/255,019

(22) Filed: Sep. 1, 2016

(65) Prior Publication Data
US 2016/0372669 A1    Dec. 22, 2016

Related U.S. Application Data

(62) Division of application No. 12/359,112, filed on Jan. 23, 2009, now Pat. No. 9,441,288.

(30) Foreign Application Priority Data

Sep. 1, 2008  (KR) .................. 10-2008-0085738

(51) Int. Cl.
  *H01L 51/00* (2006.01)
  *C23C 16/04* (2006.01)
  (Continued)

(52) U.S. Cl.
  CPC .......... *H01L 51/0011* (2013.01); *B05B 12/20* (2018.02); *C23C 14/042* (2013.01);
  (Continued)

(58) Field of Classification Search
  None
  See application file for complete search history.

(56) References Cited

U.S. PATENT DOCUMENTS 4,344,988 A * 8/1982 Sono ................ C23C 14/042
                                                    118/721
4,942,333 A * 7/1990 Knox ................ H01J 29/07
                                                    313/402
(Continued)

FOREIGN PATENT DOCUMENTS

CN    1423511       6/2003
CN    1625312 A     6/2005
(Continued)

OTHER PUBLICATIONS

Office Action dated Nov. 26, 2010 for Chinese Patent Application No. 200910170990.2.
(Continued)

*Primary Examiner* — Nathan T Leong
(74) *Attorney, Agent, or Firm* — Lewis Roca Rothgerber Christie LLP (57) ABSTRACT

A mask for thin film deposition used in forming an organic thin film or a conductive layer in an organic light emitting device is disclosed. In one embodiment, the mask includes i) a base member, ii) a plurality of slits configured to penetrate through the base member, wherein the plurality of slits have a predetermined length and extend in a first direction, wherein the plurality of slits comprise an outermost slit positioned in an outermost in a second direction having a predetermined angle with respect to the first direction, and wherein the outermost slit comprises two sub-slits separated from each other and iii) a rib supporting part formed between and contacting the two sub-slits, wherein the rib supporting part extends from a rib which is adjacent to the outermost slit.

4 Claims, 7 Drawing Sheets

(51) Int. Cl.
*C23C 18/16* (2006.01)
*C30B 25/04* (2006.01)
*C23C 14/04* (2006.01)
*H01L 51/50* (2006.01)
*B05B 12/20* (2018.01)

(52) U.S. Cl.
CPC ........ *C23C 16/042* (2013.01); *C23C 18/1605* (2013.01); *C30B 25/04* (2013.01); *H01L 51/5012* (2013.01)

(56) References Cited

U.S. PATENT DOCUMENTS

| | | | |
|---|---|---|---|
| 5,542,506 A * | 8/1996 | McMichael | F16C 32/0438 188/267 |
| 6,812,629 B2 | 11/2004 | Song et al. | |
| 6,858,086 B2 | 2/2005 | Kang | |
| 2003/0101932 A1* | 6/2003 | Kang | C23C 14/042 118/504 |
| 2004/0104197 A1 | 6/2004 | Shigemura et al. | |
| 2004/0183435 A1 | 9/2004 | Ohshita | |
| 2005/0115503 A1 | 6/2005 | Hagiwara et al. | |

FOREIGN PATENT DOCUMENTS

| | | |
|---|---|---|
| EP | 1 802 177 A1 | 6/2007 |
| JP | 09-027454 | 1/1997 |
| JP | 2003-217850 | 7/2003 |
| JP | 2004-146251 | 5/2004 |
| JP | 2004-185832 | 7/2004 |
| JP | 2004-281339 | 10/2004 |
| JP | 2005-163111 | 6/2005 |
| KR | 10 2003 0023202 A | 3/2003 |
| KR | 10 2003 0027168 A | 4/2003 |
| KR | 10 2005 0091506 A | 9/2005 |
| KR | 10 2008 0011573 A | 2/2008 |

OTHER PUBLICATIONS

Office Action dated Dec. 21, 2011 for Japanese Patent Application No. 2009-007724.

Chinese Office Action dated Feb. 3, 2012 for Chinese Patent Application No. CN 200910170990.2 which shares priority of Korean Patent Application No. KR 10-2008-0085738 with captioned U.S. Appl. No. 12/359,112.

Extended European Search Report dated Jun. 29, 2012 for European Patent Application No. EP 09 16 1245.7 which shares priority of Korean Patent Application No. KR 10-2008-0085738 with captioned U.S. Appl. No. 12/359,112.

Certificate of Patent granted Sep. 5, 2012 for Chinese Patent Application No. CN 200910170990.2 which shares priority of Korean Patent Application No. KR 10-2008-0085738 with captioned U.S. Appl. No. 12/359,112.

* cited by examiner

MASK FOR THIN FILM DEPOSITION AND METHOD OF MANUFACTURING OLED USING THE SAME

CROSS-REFERENCE TO RELATED APPLICATIONS

This application is a divisional application of U.S. patent application Ser. No. 12/359,112, filed on Jan. 23, 2009, which claims priority to and the benefit of Korean Patent Application No. 10-2008-0085738, filed on Sep. 1, 2008, in the Korean Intellectual Property Office, the entire content of which is incorporated herein by reference.

BACKGROUND

Field of the Invention

The present invention relates to a mask having slits in a stripe shape for thin film deposition and a method of manufacturing an organic light emitting display (OLED) using the same.

Discussion of the Related Technology

Generally, an organic material deposition apparatus is used to form material on a substrate in a film shape by applying current to the material to be deposited under a vacuum of about $10^{-7}$ torr or more. The organic material deposition apparatus uses a mask so as to form an organic film in a desired shape on a substrate. When depositing an organic material on a large substrate of a predetermined size, a metal mask having high durability and strength may be used in order to deposit an organic material in a desired pattern stably.

SUMMARY OF CERTAIN INVENTIVE ASPECTS

One aspect of the present invention is a mask for a thin film deposition capable of preventing masking defects in process for depositing a thin film by preventing a modification of a rib adjacent to an outermost slit in a fine metal mask having slits in a stripe shape.

Another aspect of the present invention is a method of manufacturing an organic light emitting device capable of preventing defect in an organic material deposition, using the mask for thin film deposition.

Another aspect of the present invention is a mask for thin film deposition, comprising a base member; a plurality of slits installed to penetrate through the base member, having a predetermined length, and extended in a first direction; and a rib supporting part installed between an outermost slit of the plurality of slits and a rib adjacent to the outermost slit, the outermost slit positioned in an outermost in a second direction having a predetermined angle with respect to the first direction.

The rib supporting part may be formed integrally with the base member.

The width of the rib supporting part may be about 10 μm to 100 μm.

The length of the slits may be 2 cm.

The base member may include a metal material.

The mask for thin film deposition may further comprise a frame having an opening portion in a central portion thereof and having a pair of first sides and second sides opposed to each other, wherein at least any one of the first sides and second sides are bonded with an edge of the base member.

The mask for thin film deposition may further comprise a mask strip having the base member, the plurality of slits, and the rib supporting part; a second mask strip having a second base member and a plurality of silts installed on the second base member, but not having the rib supporting part between an outermost slit and a rib adjacent to the outermost slit; and a frame having an opening portion in a central portion, and having a pair of first sides and second sides opposed to each other, wherein both longitudinal ends of the first mask strip and both longitudinal ends of the second mask strip are bonded to the first sides, and an outermost slit of the first mask strip is arranged most adjacent to the second sides.

Another aspect of the present invention is a manufacturing method of organic light emitting device which includes first and second electrodes opposed to each other on a substrate and an organic light emitting film provided between the first and second electrodes, wherein the organic light emitting film is deposited by the mask for the thin film deposition.

The manufacturing method of the organic light emitting device may further comprise applying magnetic force to the mask, so that the mask for the thin film deposition is closely adhered to the substrate on which the organic light emitting device is formed, the substrate disposed therebetween, wherein a magnet array installed so as to apply the magnetic force includes a plurality of magnets in a stripe shape, and an extended direction of the magnets have a predetermined angle with the length direction of the plurality of slits of the mask.

Another aspect of the invention is a mask for thin film deposition, comprising: a base member; and a plurality of slits penetrating through the base member, wherein the plurality of slits have a predetermined length and extend in a first direction, wherein the plurality of slits comprise an outermost slit positioned in an outermost location in a second direction having a predetermined angle with respect to the first direction, and wherein the outermost slit comprises two sub-slits separated from each other by a rib supporting part.

In the above mask, the rib supporting part is integrally formed with the base member. In the above mask, the width of the rib supporting part is about 10 μm to about 100 μm. In the above mask, the length of the slits is about 2 cm. In the above mask, the base member is formed of a metal material.

The above mask may further comprise: a frame comprising a pair of first sides and second sides opposed to each other, wherein an opening is defined in the frame by the inner perimeter of the first and second sides, wherein at least one of the first sides and second sides is connected to an edge of the base member.

The above mask may further comprise: a mask strip comprising the base member, the plurality of slits, and the rib supporting part; a second mask strip comprising a second base member and a plurality of silts defined in the second base member, wherein the second mask strip does not include a rib supporting part; and a frame comprising a pair of first sides and second sides opposed to each other, wherein an opening is defined in the frame by the inner perimeter of the first and second sides, wherein both longitudinal ends of the first mask strip and both longitudinal ends of the second mask strip are bonded to the first sides, and wherein an outermost slit of the first mask strip is arranged most adjacent to the second sides. In the above mask, the rib supporting part extends from a rib which is adjacent to the outermost slit.

Another aspect of the invention is a method of manufacturing an organic light emitting device, comprising: providing a mask which comprises i) a base member, ii) a plurality of slits defined in and passing through the base member, wherein the plurality of slits comprise an outermost slit separated into two sub-slits and iii) a rib supporting part formed between the two sub-slits, and wherein the rib supporting part extends from a rib which is adjacent to the outermost slit; and depositing an organic light emitting film, through the slits of the mask, between first and second electrodes of the organic light emitting device, wherein the first and second electrodes are formed over a substrate.

The above method may further comprise: applying, with the use of a magnet array, magnetic force to the mask so that the mask is closely adhered to the substrate, wherein the substrate is disposed between the mask and the magnet array, wherein the magnet array comprises a plurality of magnets in a stripe shape, and wherein an extended direction of the magnets have a predetermined angle with the length direction of the plurality of slits of the mask.

In the above method, the width of the rib supporting part is about 10 μm to about 100 μm. In the above method, the length of the slits is at least about 2 cm.

Another aspect of the invention is a mask for thin film deposition, comprising: a base member; a plurality of through-slits defined in the base member, wherein the plurality of through-slits have a predetermined length and extend in a first direction, and wherein the plurality of through-slits comprise an outermost slit separated into two sub-slits; a plurality of ribs each being formed between two adjacent ones of the plurality of through-slits, wherein the plurality of ribs comprise an outermost rib adjacent to the outermost slit; and a rib support extending from the outermost rib and between the two sub-slits.

In the above mask, the plurality of through-slits are substantially parallel with each other. In the above mask, the width of the outermost slit is about 50 μm. In the above mask, the width of the outermost rib is about 10 μm to about 100 μm.

The above mask may further comprise: a frame comprising a pair of first sides and second sides opposing each other, wherein an opening is defined in the frame by the inner perimeter of the first and second sides, wherein at least one of the first sides and second sides is connected to an edge of the base member.

The above mask may further comprise: a mask strip comprising the base member, the plurality of through-slits, a plurality of ribs and the rib support; and a second mask strip comprising i) a second base member, ii) a plurality of through-silts defined in the second base member and iii) a plurality of ribs.

The above mask may further comprise: a frame comprising a pair of first sides and second sides opposing each other, wherein an opening is defined in the frame by the inner perimeter of the first and second sides, wherein both longitudinal ends of the first mask strip and both longitudinal ends of the second mask strip are bonded to the first sides, and wherein an outermost slit of the first mask strip is arranged adjacent to the second sides. In the above mask, the rib support is integrally formed with the base member.

DETAILED DESCRIPTION OF CERTAIN INVENTIVE EMBODIMENTS

A fine metal mask (FMM) is used for depositing an organic material in a fine pattern on a large substrate. A plurality of organic materials in a desired fine pattern may be formed on a predetermined position of the substrate at a time using the FMM. In order to deposit the organic material in a desired pattern, the FMM may include a plurality of parallelpiped slots through which the organic materials pass or include slits in a stripe shape. Here, the plurality of parallelpiped slots or slits in a stripe shape may form a unit masking part, and the FMM may include a plurality of unit masking parts. The deposition technique using such a FMM may be used for forming an electrode and for depositing an organic material for manufacturing a large organic light emitting display apparatus.

A magnet array is commonly used for fixing a metal mask on a substrate. The magnet array is installed to attract the metal mask having the substrate therebetween so that the metal mask is closely fixed to the substrate. The magnet array may be installed in a structure that a plurality of magnets in a stripe shape having a predetermined length are fixed on an array frame.

Meanwhile, in the FFM having a plurality of slits in a stripe shape, the width of a rib between slits is narrow, so the rib may be bent by an external force. In particular, in the metal mask, the rib adjacent to an slit positioned in the outermost of the unit masking part in the width direction approximately perpendicular to a longitudinal direction of the slit is applied with a stronger force than ribs between other slits, due to a strong magnetic force involved in an end portion in a longitudinal direction of the stripe magnet. In this situation, the rib adjacent to the outermost slit may be bent by the magnetic force.

If the rib adjacent to the outermost slit is bent in the organic material deposition apparatus, a slit region adjacent to the outermost slit is not properly masked when depositing an organic material, thereby causing defect in an organic material deposition. The defect in the organic material deposition in the slit region adjacent to the outermost slit may cause a defect in an organic material used as an organic light emission layer of an organic light emitting device. In this case, at least one cell may reveal an undesired peculiar color to cause the defect of device, the cell being positioned in the slit region adjacent to the outermost slit when lighting the organic light emitting device.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

Hereinafter, certain exemplary embodiments according to the present invention will be described with reference to the accompany drawings. However, the present invention may be implemented in diverse forms but not be limited to the embodiments described herein.

Figure 1:
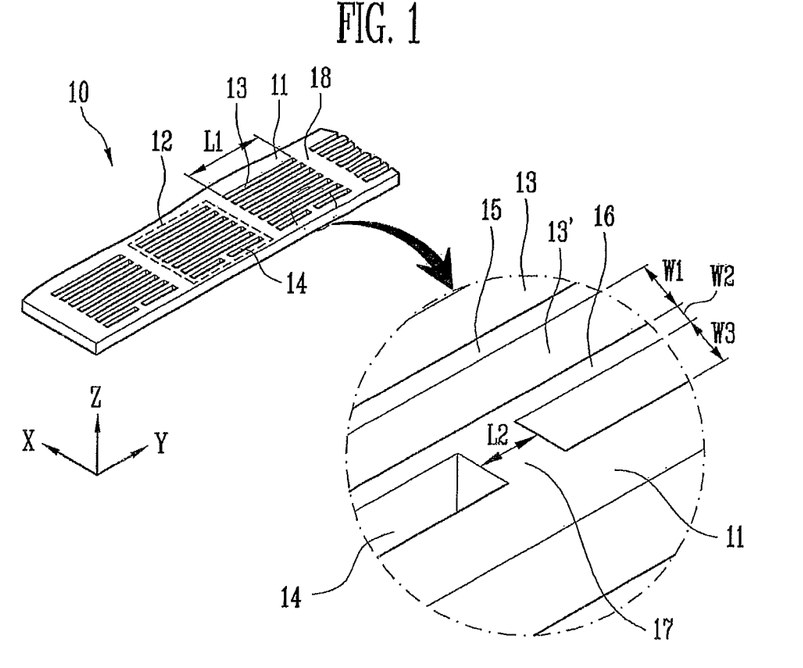
FIG. 1 is a partial perspective view illustrating a mask for a thin film deposition according to one embodiment of the present invention.

FIG. 1 is a partial perspective view illustrating a mask for a thin film deposition according to one embodiment of the present invention.

Referring to FIG. 1, the mask 10 includes a base member 11 and slits (or through-slits) 13 penetrating through the base member 11 in a thickness direction. The slits 13 are interposed between ribs 15 and formed in a stripe shape that is extended in a first direction or a Y direction.

The mask 10 includes a rib supporting part (or rib support) 17 installed crossing an outermost slit 14 (separated into two sub-slits as shown in FIG. 1) of a group of slits 13, the outermost slit positioned in the outermost in a second direction having a predetermined angle with respect to a first direction, or an X direction. The rib supporting part 17 connects a rib (or outermost rib) adjacent to the outermost slit 14, that is, a rib 15 forming a first surface of the outermost slit 14, to the base member 11 forming a second surface facing the first surface of the outermost slit 14. In another embodiment, at least one other rib supporting part (or rib support) may be formed to support, for example, the second outermost rib 15. In this embodiment, the second outermost slit 13' is separated into two sub-slits.

In one embodiment, the rib supporting part 17 is formed integrally with the base member 11. Meanwhile, in order to obtain the same function and effect as the rib supporting part 17 described above, a separate member may be used instead of the rib supporting member. However, when installing the rib supporting part 17 using a separate member, the separate member is installed between a rib 16 adjacent to the outermost slit 14 and the base member 11 so that the rib supporting part 17 is extended crossing an inner region of the outermost slit 14, thereby causing complexity in the process for manufacturing the mask.

In one embodiment, the outermost slit 14 is indicated by a different reference numeral to be distinguished from the other slits 13, and the rib adjacent to the outermost slit 14 is indicated by a different reference numeral to be distinguished from another rib 15. However, in the following explanation, the outermost slit 14 and rib 15 may basically be considered to be included in the group of slits 13 and rib 15 forming a unit masking pattern part 12, respectively.

The group of slits 13 and ribs 15 between the slits form the rectangular unit masking pattern part 12. FIG. 1 shows three unit masking pattern parts 12 and a part of the fourth unit masking pattern part. Each unit masking pattern part 12 is installed in a predetermined pattern such that an organic material or a conductive material can pass through the unit masking pattern part 12 in a predetermined pattern in order to deposit organic light emission layer or electrode layer of one organic light emitting display apparatus. For example, a pattern space part 18 is installed between adjacent two unit masking pattern parts 12, wherein the adjacent two unit masking pattern parts 12 are spaced from each other with a predetermined distance in the first direction.

The mask 10 may be manufactured using a material molding technique such as electroforming process. Fine patterning and excellent surface flatness can be obtained using the electroforming process.

The mask 10 may also be manufactured by an etching method. For example, the slits 13 including the outermost slit 14 of the mask 10 for thin film deposition may be formed by forming a resist layer having the same pattern as the slits 14 on a thin plate base member 11 using a photo resist, or attaching a film having the same pattern as the slits 14 on the base member 11, and then etching the base member 11.

In one embodiment, in each of the unit masking pattern parts 12, the length L1 of each slit 13 is about 2 cm or more, the width W1 of the slit 13 and the width W3 of the outermost slit 14 are about 50 μm, and the distance between the slits 13, that is the width W2 of the rib 15, is about 10 μm to about 100 μm. The width W2 of the rib 16 adjacent to the outermost slit 14 is also about 10 μm to about 100 μm. If the entire length L1 of the outermost slit 14 including the length L2 of the rib supporting part 17 is about 2 cm and the width W2 of the rib 16 is about 10 μm to about 100 μm, the rib 16 may be bent by magnetic force of the magnet array. However, the rib supporting part 17 may prevent the rib 16 from being bent. In another embodiment, L1, L2 and W1-W3 may have values different from those described above.

The outermost slit 14 may be a dummy slit whose masking effect for the slit 13' adjacent to the outermost slit 14 is the same as the masking effect for other slits 13. In this case, the length L2 of the rib supporting part 17 may be controlled optionally in the range that the length L2 of the rib supporting part 17 has the length capable of supporting the rib 16 adjacent to the outermost slit 14 and does not have a bad influence on the masking effect of the slit 13' adjacent to the outermost slit 14.

The base member may be formed of nickel, a nickel alloy, a nickel-cobalt alloy, or the like. When using a nickel-cobalt alloy, a fine pattern can is formed with ease and a surface roughness is very excellent.

Next, a problem that may occur when the rib supporting part 17 is not installed will be described in more detail.

Figure 2A:
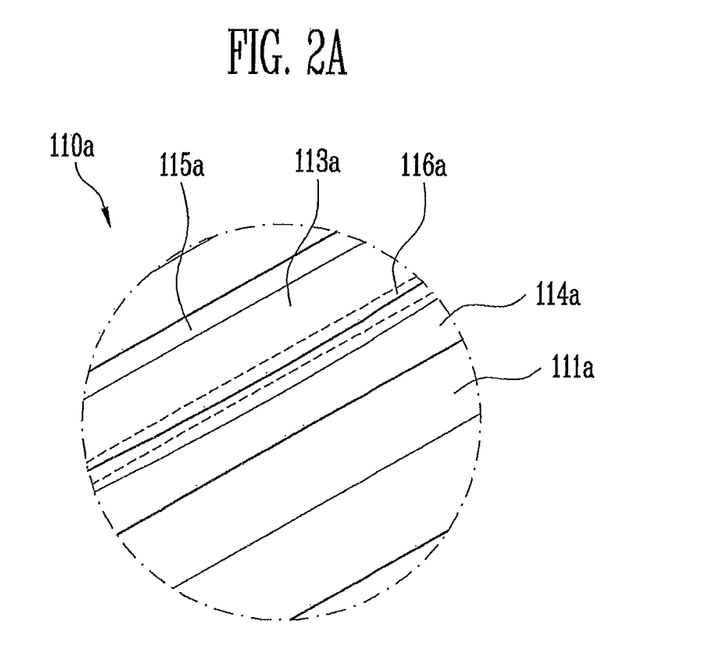
FIGS. 2A and 2B are perspective views illustrating metal masks of comparative examples.
Figure 2B:
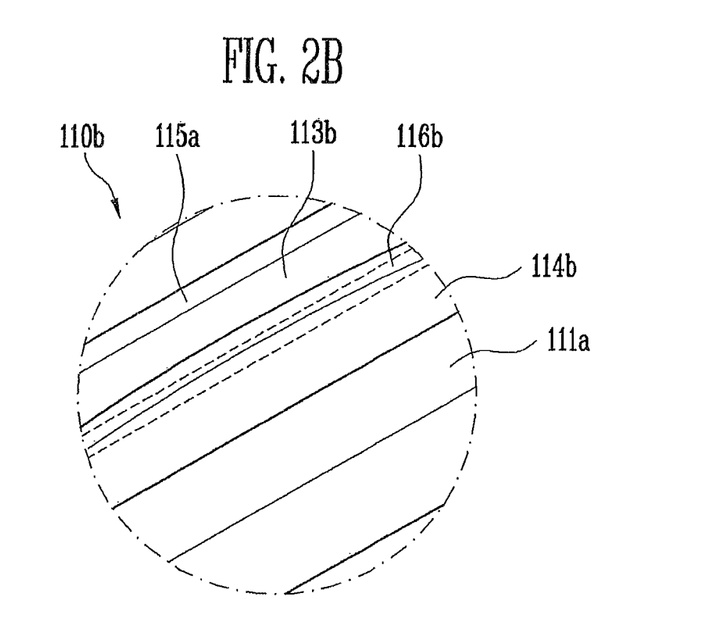

Referring to FIGS. 2A and 2B, metal masks 110a, 110b include slits 113a in a stripe shape and a rib 115a installed between the slits. An outermost slit 114a positioned in the outermost in the width direction substantially perpendicular to a longitudinal direction of the slits 113a is installed between a rib adjacent to the outermost slit 114a and a base member 111a, the rib being a rib 116a forming one surface of the outermost slit 114a.

The metal masks 110a and 110b of the comparative example of certain embodiments of the present invention may be closely adhered on a substrate by a magnet array installed in a deposition apparatus. Here, the magnet array may be disposed such that a magnet in a stripe shape is extended in the width direction substantially perpendicular to the length direction of the slits 113a (see FIGS. 5, 6A and 6B). At this time, the rib 116a may be positioned to be adjacent to one end portion of the magnet in a stripe shape. In this case, magnetic force is concentrated on both end portions of the magnet in a stripe shape instead of other portions, so the rib 16 may be bent easily by the strong magnetic force applied to the end portions of the magnet compared to other rib 115a. In other words, the rib 116a may be bent such that the width of the outermost slit 114a becomes narrow as shown in FIG. 2A, or be bent such that the width of the outermost slit 114a becomes wide as shown in FIG. 2B.

As described above, the rib 116a may be bent by the magnetic force of the magnet array. In this case, the defect occurs in an organic light emission layer deposited through the slit 113a adjacent to the outermost slit 114a so that at least one cell may reveal an undesired peculiar color to cause the defect of device, the cell being positioned in the slit region adjacent to the outermost slit through the corresponding slit when lighting the organic light emitting device.

Figure 3:
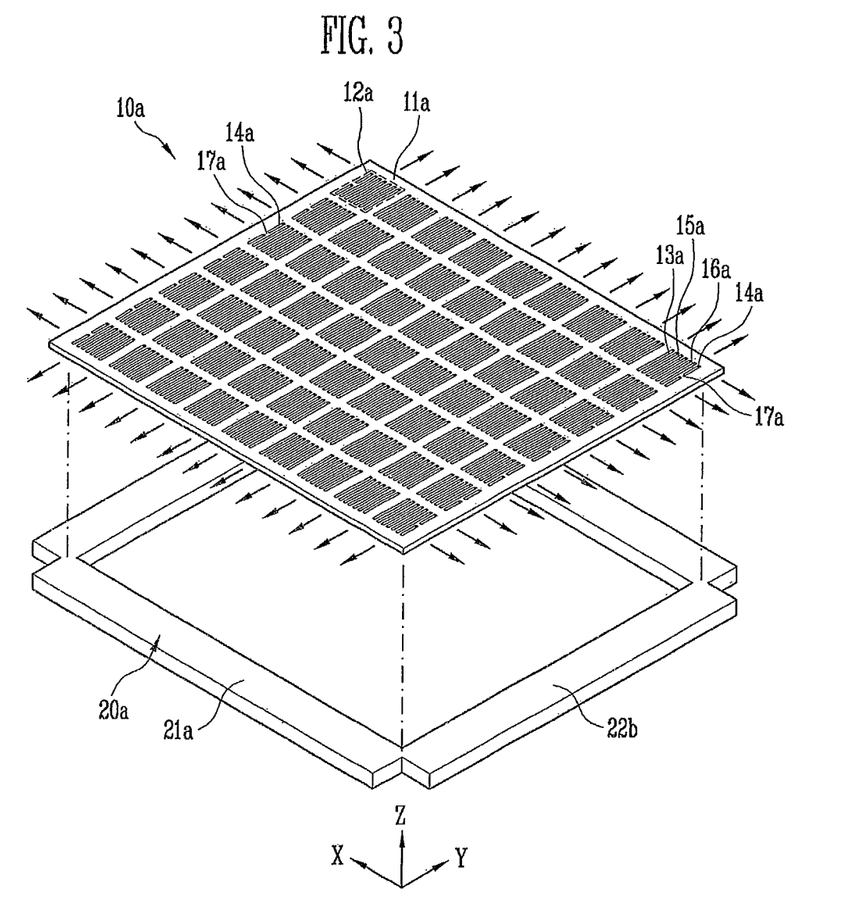
FIG. 3 is an exploded perspective view of a mask for a thin film deposition according to an embodiment of the present invention.

FIG. 3 is an exploded perspective view of a mask for a thin film deposition according to an embodiment of the present invention.

Referring to FIG. 3, a mask assembly a mask 10a and a frame 20a, the mask assembly being an apparatus for mass production.

The mask 10a includes a plurality of unit masking pattern parts 12a formed on a metal thin plate base member 11a so that several unit substrates forming an organic light emitting device can be deposited at a time. The plurality of unit masking pattern part 12a may be arranged in a lattice shape. Each unit masking pattern part 12a includes a plurality of slits 13a patterned in a desired shape and a rib 15a positioned between the adjacent slits, the unit masking pattern part 12a capable of depositing an organic material on one device.

In particular, the mask 10a includes a rib supporting part 17a in the unit masking pattern part 12a positioned in an end portion of a magnet in a stripe shape provided in a magnet array. In consideration of the case when the magnet in a stripe shape is extended in an X axis direction, the rib supporting part 17a is installed inside an outermost slit 14a of the unit masking pattern part 12 positioned on both end portions of the magnet in the X axis. In other words, the rib supporting part 17a is extended crossing each outermost slit 14a of two groups of unit masking patterns positioned in the both outermost in the X direction of the mask 10a, and connects a rib adjacent to the outermost slit 14a, that is, a rib 16a forming one surface of the outermost slit 14a, to a base member 11a positioned on other surface facing the one surface of the outermost slit 14a.

The mask 10a is fixed to a frame 20a such that tensile force is applied, in order to prevent the masking defects for a certain device at the time of mass production. In other words, the mask 10a is fixed to the frame 20a in a rectangular shape so that the width of the slit 13a formed in each unit masking pattern part 12a is maintained within the range of a preset tolerance.

In one embodiment, the frame 20a is formed of a member having stiffness so as to support the mask 10a. The frame 20a includes a pair of first sides 21a substantially parallel to each other, and a pair of second sides 22a each connecting both ends of the pair of the first sides 21a. The first side 21a and second side 22a of the frame 20a are formed integrally with each other, but not are limited thereto. Instead, they may be manufactured separately as first and second sub frames to be coupled to each other.

Figure 4:
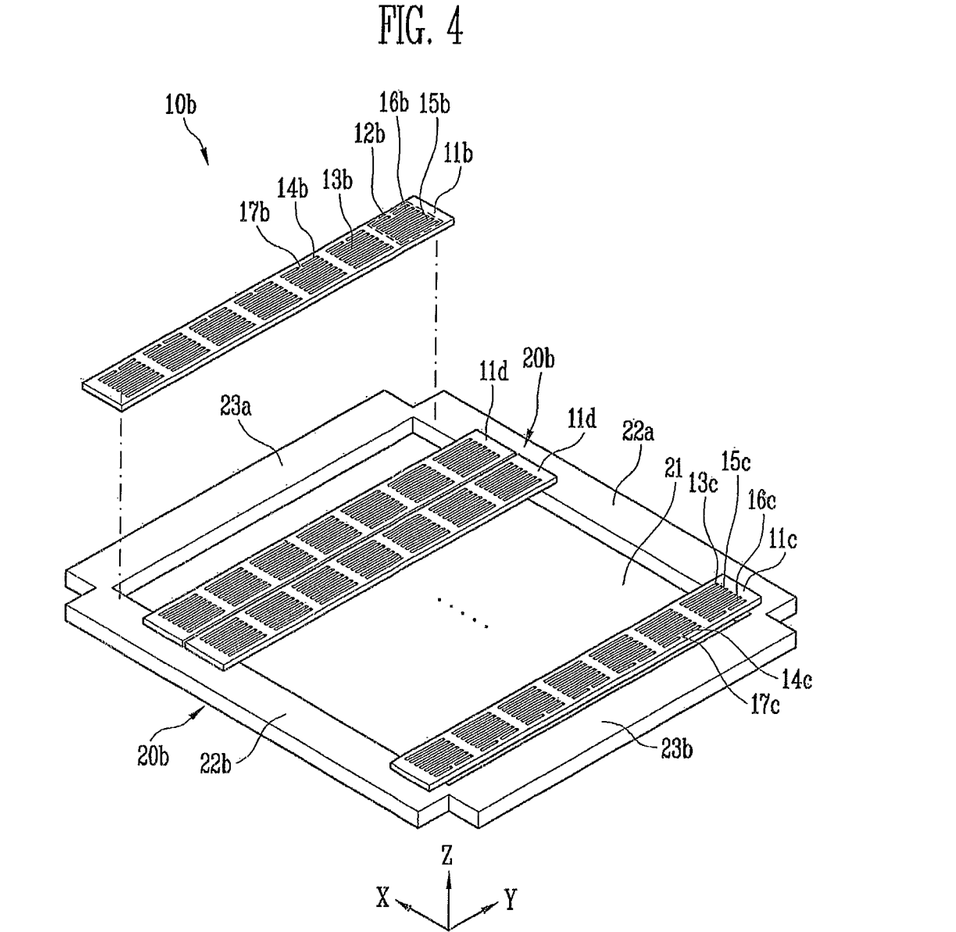
FIG. 4 is an exploded perspective view of a mask for a thin film deposition according to an embodiment of the present invention.

FIG. 4 is an exploded perspective view of a mask for a thin film deposition according to an embodiment of the present invention.

Referring to FIG. 4, a mask assembly includes a mask 10b and a frame 20b, the mask assembly being an apparatus for mass production.

The mask 10b includes i) a first mask strip 11b installed on one side of the frame 20b, ii) a second mask strip 11c installed on the other side of the frame 20b, and iii) third mask strips 11d installed in the middle of the frame 20b. The mask 10b includes a plurality of unit masking pattern parts 12b formed on a metal thin plate base member 11a so that several unit substrates forming an organic light emitting device can be deposited at a time. The plurality of unit masking pattern part 12b may be arranged in a row in a Y direction having predetermined intervals. Each unit masking pattern part 12b includes a plurality of slits 13b patterned in a desired shape and a rib 15b positioned between the adjacent slits, the unit masking pattern part 12b capable of depositing an organic material on one device.

The first mask strip 11b includes a rib support part 17b inside an outermost slit 14b of each unit masking pattern part 12b positioned farthest from the third mask strip 11d in the X axis direction. Similarly, the second mask strip 11c includes a rib support part 17c inside an outermost slit 14c of each unit masking pattern part 12b positioned farthest from the third mask strip 11d in the X axis direction. In consideration of the case when a magnet in a stripe shape is extended in an X axis direction, the magnet being provided in a magnet array, the rib supporting parts 17b and 17c are installed inside the outermost slit 14b and 14c of the unit masking pattern part 12 positioned on both end portions of the magnet in the X axis. In other words, the rib supporting parts 17b and 17c extend to cross the respective outermost slits 14b and 14c of two groups of unit masking patterns positioned in the both outermost in the X direction of the mask 10b, and connect ribs adjacent to the outermost slits 14b and 14c, that is, ribs 16b and 16c forming one surface of the outermost slits 14b and 14c, to a base member positioned on other surface facing the one surface of the outermost slits 14b and 14c.

The respective mask strips 11b, 11c, and 11d are fixed to a frame 20b such that tensile force is applied in order to prevent the masking defects for a certain device at the time of mass production. In other words, the respective mask strips 11b, 11c, and 11d are fixed to the pair of first sides 21b facing the frame 20b in a rectangular shape so that the length or the width of the slits 13b and 13c formed in each unit masking pattern part remains within the range of a preset tolerance.

The frame 20b may be formed of a member having stiffness so as to support the respective mask strips 11b, 11c, and 11d. The frame 20b includes a pair of first sides 21b parallel to each other, and a pair of second sides 22b each connecting both ends of the pair of the first sides 21b. The first side 21b and second side 22b of the frame 20a may be formed integrally with each other, but not are limited thereto. Instead, they may be manufactured separately as first and second sub frames to be coupled to each other.

Meanwhile, a structure of the frame 20b is not limited to FIG. 4 and the explanation thereof, but may of course be implemented as various modifications. For example, a structure or a separate member for allowing mask strips to be bonded to the frame 20b may be used.

The mask assembly may be used as various thin film depositions, particularly, be used in process for patterning an organic film. For example, the mask assembly may be used in patterning an organic light emitting film of an organic light emitting display apparatus, and may also be used in process for depositing a cathode electrode in a passive organic light emitting display apparatus. The mask assembly may also be used in forming an organic thin film transistor.

Figure 5:
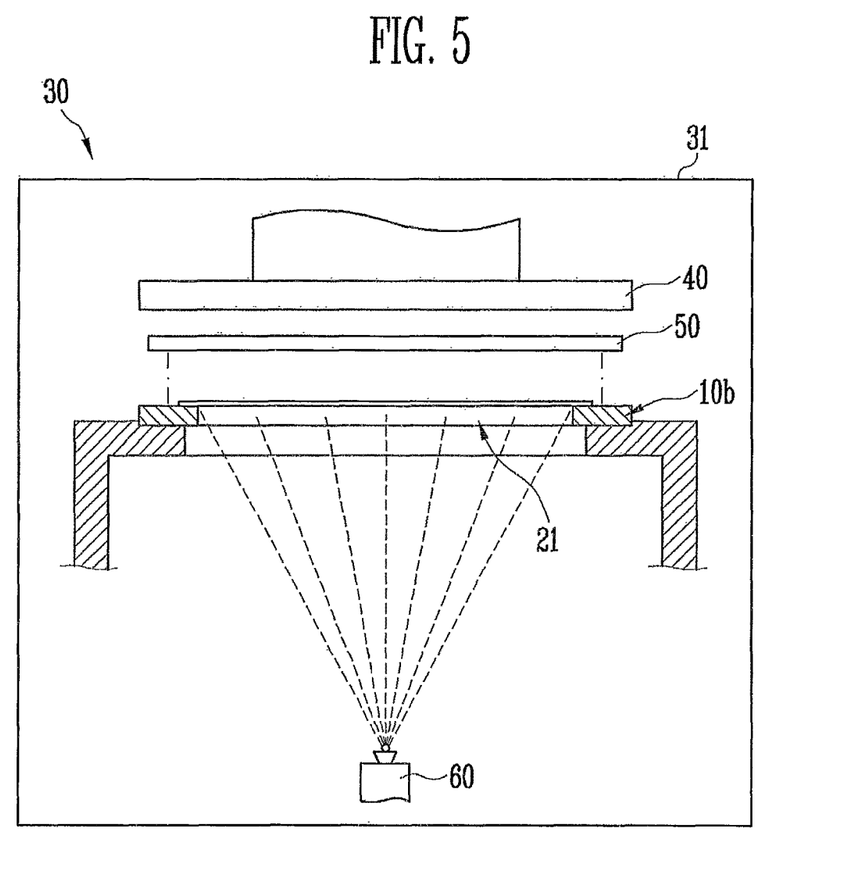
FIG. 5 is a schematic view illustrating a process for depositing a thin film using a mask for a thin film deposition according to one embodiment of the present invention.

FIG. 5 is a schematic view illustrating process for depositing a thin film using a mask for a thin film deposition according to one embodiment of the present invention.

Referring to FIG. 5, the deposition apparatus 30 may use the mask 10b for thin film deposition as described above with reference to FIG. 4.

In order to deposit red R, green G, and blue B organic light emitting films of an organic light emitting display apparatus, the mask 10b is installed on an organic film deposition crucible 60 installed in a vacuum chamber 31, and a substrate 50 on which a thin film is to be formed is mounted on the mask 10b. The mask 10b is then closely adhered to the substrate 50 by driving a magnet array 40. In this state, if the organic film deposition crucible 60 operates, an organic material mounted in the organic film deposition crucible 60 is evaporated to pass through slits of the mask 10b, thereby being deposited on the substrate 50 in a predetermined pattern.

Figure 6A:
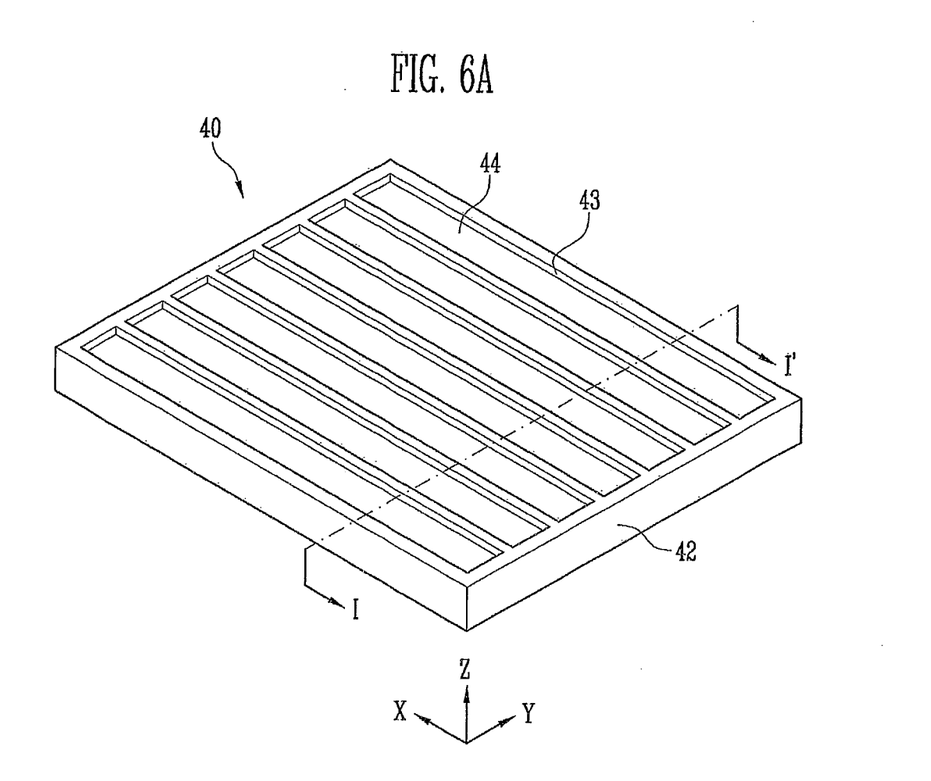
FIG. 6A is a perspective view of a main part of a magnet array which can be adopted to the deposition apparatus of FIG. 5.
Figure 6B:
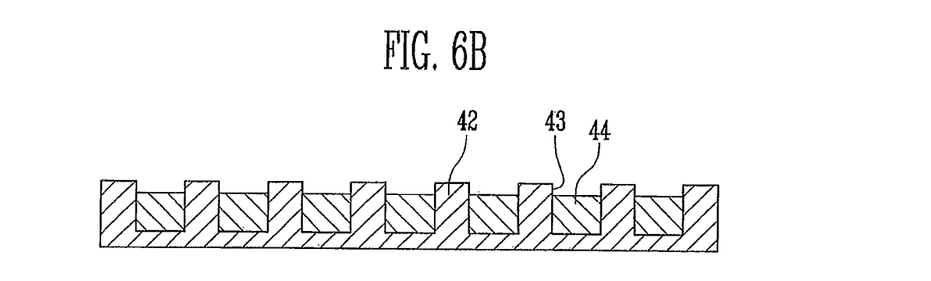
FIG. 6B is a cross-sectional view taken along line I-I' of the magnet array of FIG. 6A.

FIG. 6A is a perspective view of a main part of a magnet array which can be adopted to the deposition apparatus of FIG. 5. FIG. 6B is a cross-sectional view taken along line I-I' of the magnet array of FIG. 6A.

As shown in FIGS. 6A and 6B, when an organic material is deposited in an organic deposition apparatus, a magnet array 40 is used so as to closely fix the mask on one surface of a substrate. At this time, the magnet array 40 is formed such that a plurality of rod-shaped magnets 44 are commonly arranged in a row in order to appropriately support the mask 10b having a relatively large size with magnetic force. For example, the magnet array 40 may include a plurality of rod-shaped magnets 44 and bodies 42 having grooves 43 into which the respective magnets 44 are inserted.

In the aforementioned case, when the slit of the mask 10b is extended n the Y axis direction, each rod-shaped magnet 44 of the magnet array 40 is extended in the X axis direction, so the ribs adjacent to the outermost slits positioned on both end portions of the respective magnets 44 receive a large magnetic force. At this time, in the existing metal mask, the rib positioned between the outermost slit and the slit adjacent the outermost slit may be bent by the magnetic force of the magnet. However, the mask 10b according to at least one embodiment of the present embodiment includes the rib supporting part, making it possible to prevent the slit from being bent, the slit being positioned between the outermost slit and the slit adjacent the outermost slit.

Figure 7:
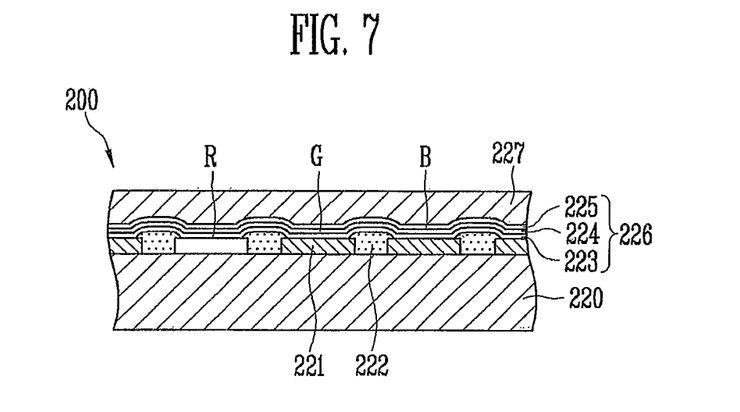
FIG. 7 is a cross-sectional view showing an example of a passive organic light emitting display apparatus manufactured using a mask for a thin film deposition according to one embodiment of the present invention.

FIG. 7 is a cross-sectional view showing an example of a passive organic light emitting display apparatus manufactured using a mask for a thin film deposition according to one embodiment of the present invention.

Referring to FIG. 7, a first electrode layer 221 is formed in a stripe shape on a glass substrate 220, and an organic layer 226 and a second electrode layer 227 are formed sequentially on the first electrode layer 221. An insulating layer 222 may be interposed between lines of the first electrode layer 221. The second electrode layer 227 may be formed in a pattern substantially perpendicular to a pattern of the first electrode layer 221.

The organic layer 226 may use a low or high molecular organic layer. When a low molecular organic layer is used, the organic layer 226 may be formed in a single or complex structure that a first organic layer 223 and a second organic layer 225 are stacked, the first organic layer 223 including a hole injection layer, a hole transport layer, and the like, and the second organic layer 225 including an organic light emission layer 224, a electron transport layer, an electron injection layer (EIL) and the like. The organic layer 226 may use organic materials such as copper phthalocyanine (CuPu), N,N'-Di(naphthalene-1-yl)-N—N'-diphenylbenzidine (NPB), tris-8-hydroxyquinoline aluminum (Alq3) or the like. These low molecular organic layers may be formed using a vacuum deposition method.

When a high molecular organic layer is used, the organic layer 226 may be formed in a structure that a first organic layer 223 including a hole transport layer (HTL) and an organic light emission layer 224 are stacked. At this time, a second organic layer 225 may not be used. The high molecular organic layer 226 may use poly (3,4-ethylenedioxythiophene) (PEDOT) as the hole transport layer, and polyphenylenevinylene-based and polyfluorene-based high molecular organic materials as the emission layer.

The organic light emission layer 224 may be formed to implement a full-color by having red R, green G and blue B. The organic light emission layer 224 is formed using a mask for a thin film deposition. If using the mask according to one embodiment of the present embodiment, the organic light emission layer 224 prevents the defects in the mask patterns generated as the rib adjacent to the outermost slit is bent, making it possible to prevent the occurrence of defects in the deposition patterns of the organic light emission layer 224.

The first electrode layer 221 as described above functions as an anode electrode, and the second electrode as described above functions as a cathode electrode. These first and second electrodes 221 and 227 may of course be implemented to have opposite polarities.

The first electrode 221 may include a transparent electrode or a reflective electrode. When using the transparent electrode, the first electrode 221 may be formed of ITO, IZO, ZnO or $In_2O_3$. When using the reflective electrode, the first electrode 221 may form a reflective film using Ag, Mg, Al, Pt, Pd, Au, Ni, Nd, Ir, Cr, the compound thereof, or the like and then be formed of ITO, IZO, ZnO or $In_2O_3$ on the reflective film.

Meanwhile, the second electrode 227 may also include a transparent electrode or a reflective electrode. When using the transparent electrode, the second electrode 227 is used as a cathode electrode, so that after metals having a small work function, that is, Li, Ca, LiF/Ca, LiF/Al, Al, Ag, Mg, and the compound thereof are deposited to face the direction of the organic light emission layer 226, an auxiliary electrode layer of a bus electrode line may be formed of materials for forming a transparent electrode, such as ITO, IZO, ZnO or In2O3, on the deposited metals. When the second electrode layer 227 is used as the reflective electrode, the second electrode layer 227 may be formed by depositing Li, Ca, LiF/Ca, LiF/Al, Al, Ag, Mg and the compound thereof. Although not shown in the drawing, such an organic light emitting display apparatus is sealed so that infiltration of external oxygen and moisture is blocked.

Figure 8:
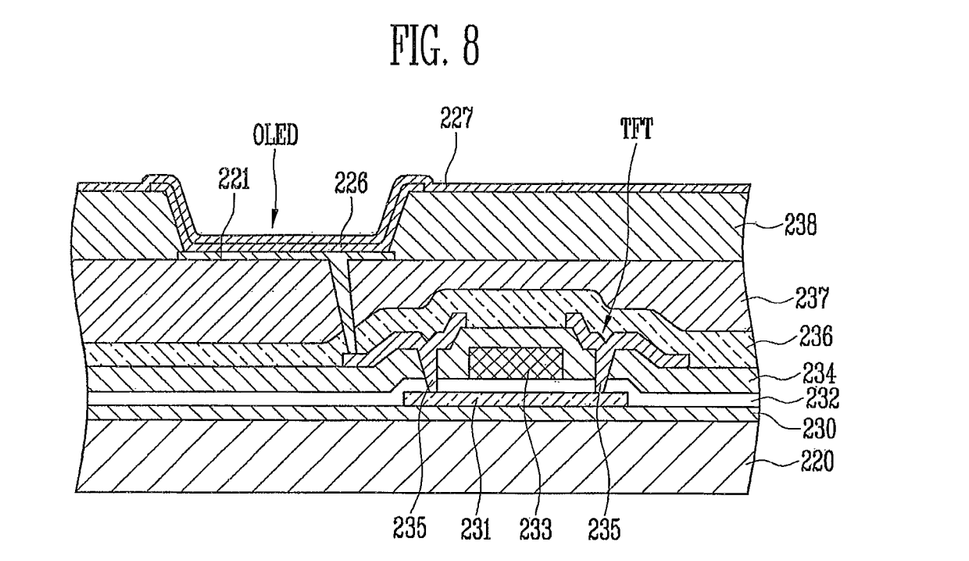
FIG. 8 is a cross-sectional view showing an example of one sub-pixel of an active organic light emitting display apparatus manufactured using a mask for a thin film deposition according to one embodiment of the present invention.

FIG. 8 is a cross-sectional view showing an example of one sub-pixel of an active organic light emitting display apparatus manufactured using a mask for a thin film deposition according to one embodiment of the present invention.

In FIG. 8, the sub pixels include at least one thin-film transistor (TFT) and EL device OLED which is a self-luminous device. The TFT is not always available in the structure shown in FIG. 8, but may be diversely modified in the number and structure of the TFT. The active matrix-type organic light emitting display apparatus will be described in detail.

As shown in FIG. 8, a buffer layer 230 is formed on a substrate 220, and a TFT is provided on the buffer layer 230. The TFT includes a semiconductor active layer 231 formed on the buffer layer 230, a gate insulating film 232 formed to cover the active layer 231, and a gate electrode 233 on the gate insulating film 232. An interlayer insulating film 234 is formed to cover the gate electrode 233, and source and drain electrodes 235 are formed on the interlayer insulating film 234. The source and drain electrodes 235 are coupled to a source region and a drain region of the active layer 231, respectively, by contact holes formed on the gate insulating film 232 and the interlayer insulating film 234.

In one embodiment, the active layer 231 includes a channel region coupling the source region to the drain region. Such an active layer 231 may be formed by being selected by an inorganic semiconductor or an organic semiconductor, or be formed by doping its source region or drain region with n-type or p-type impurities.

The inorganic semiconductor forming the active layer 231 may include CdS, GaS, ZnS, CdSe, CaSe, ZnSe, CdTe, SiC, and Si.

The organic semiconductor forming the active layer 231 may include semiconductive organic material whose band gap is 1eV to 4eV, wherein a high molecular organic material may include polythiophen and derivatives thereof, poly-phenylene vinylene and derivatives thereof, poly-paraphenylene and derivatives thereof, polyfluorenes and derivatives thereof, polythiophene vinylene and derivatives thereof, and polythiophen-heterocyclic aromatic copolymer and derivatives thereof, and a low molecular organic material may include pentacene, tetracene, oligocene of naphthalene and derivatives thereof, alpha-6-thiophene, oligothiophene of alpha-5-thiophene and derivatives thereof, phthalocyanine containing or not containing a metal and derivatives thereof, pyromellitic dianhydride or pyromellitic diimides and derivatives thereof, perylene tetracarboxylic acid dianhydride or perylene tetracarboxylic diimides and derivatives thereof.

The gate insulating film 232 may be formed of $SiO_2$ or the like, and also be formed of SiNx or a double film of $SiO_2$ and SiNx. A gate electrode 233 formed of a conductive metal film such as MoW, Al, Cr, Al/Cu or the like is formed on a predetermined region on the gate insulating film 232. The material forming the gate electrode 233 is not always limited thereto, but diverse conductive materials such as conductive polymer may be used as the gate electrode 233. The region on which the gate electrode 233 is formed corresponds to the channel region of the active layer 231.

The interlayer insulating film 234 may be formed of $SiO_2$ or SiNx or the compound thereof, and the source/drain electrodes 235 may be formed of the same material as the gate electrode 233.

A passivation film 236 formed of SiO2, SiNx or the like may be formed on the source/drain electrodes 235, and a planarization film 237 formed of acryl, polyimide or the like may be formed on the passivation film 236.

Although not shown in the drawing, at least one capacitor may be coupled to the TFT.

The source/drain electrodes 235 are coupled to the first electrode layer 221 which becomes the anode electrode of the organic light emitting device OLED. The first electrode layer 221 is formed on the planarization film 237, and a pixel defining layer 238 is formed to cover the first electrode layer 221. And, after forming a predetermined opening portion on the pixel defining layer 238, the organic light emitting device OLED is formed.

The organic lighting emitting device OLED, which displays predetermined image information by light-emitting red, green and blue light according to the flow of current, includes the first electrode layer 221 coupled to the source/drain electrode 235 of the TFT to receive plus power from the TFT, the second electrode 227 provided so as to cover the entire pixels to supply minus power, and an organic layer 226 disposed between the first electrode layer 221 and second electrode layer 227 to be light-emitted.

The organic layer 226 is the same as the organic layer of FIG. 7, so detailed description thereof will be omitted.

With the active matrix-type organic light emitting display apparatus according to at least one embodiment of the present embodiment, the organic light emission layer EML is formed of the mask of the present embodiment described above, making it possible to prevent the defects in the mask patterns generated as the rib adjacent to the outermost slit is bent.

Meanwhile, likewise the passive matrix-type organic light emitting display apparatus, the first electrode layer 221 may be formed as the transparent electrode or the reflective electrode, and be formed in shapes corresponding to opening shapes of the respective sub-pixels. Also, the second electrode layer 227 may be formed by depositing the transparent electrode or the reflective electrode over the whole display region. However, the second electrode layer 227 is not always entirely deposited, but be formed in diverse patterns.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an organic light emitting device, comprising:
   providing a mask which comprises i) a base member, ii) a plurality of slits penetrating through the base member, and iii) a plurality of ribs each being formed between two adjacent ones of the slits, wherein the plurality of slits comprise an outermost slit positioned in an outermost location, wherein only the outermost slit comprises two sub-slits separated from each other by a rib supporting part, wherein the plurality of ribs comprise an outermost rib adjacent to the outermost slit, and wherein each of the sub-slits is fully enclosed by the outermost rib and the rib supporting part; and
   depositing an organic light emitting film, through the slits of the mask, between first and second electrodes of the organic light emitting device, wherein the first and second electrodes are formed over a substrate.

2. The method of manufacturing the organic light emitting device as claimed in claim 1, further comprising:
   applying, with the use of a magnet array, magnetic force to the mask so that the mask is closely adhered to the substrate, wherein the substrate is disposed between the mask and the magnet array, wherein the magnet array comprises a plurality of magnets in a stripe shape, and wherein an extended direction of the magnets have a predetermined angle with the length direction of the plurality of slits of the mask.

3. The method of manufacturing the organic light emitting device as claimed in claim 1, wherein the width of the rib supporting part is about 10 μm to about 100 μm.

4. The method of manufacturing the organic light emitting device as claimed in claim 1, wherein the length of the slits is at least about 2 cm.

* * * * *